(12) United States Patent
Singh et al.

(10) Patent No.: US 9,792,400 B2
(45) Date of Patent: Oct. 17, 2017

(54) DETERMINATION OF FLIP-FLOP COUNT IN PHYSICAL DESIGN

(71) Applicant: Xpliant, San Jose, CA (US)

(72) Inventors: Chirinjeev Singh, San Jose, CA (US); Nikhil Jayakumar, San Jose, CA (US); Weihuang Wang, Los Gatos, CA (US); Weinan Ma, San Jose, CA (US); Daman Ahluwalia, Los Gatos, CA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 14/675,356

(22) Filed: Mar. 31, 2015

(65) Prior Publication Data

US 2017/0068769 A1    Mar. 9, 2017

(51) Int. Cl.
*G06F 17/50* (2006.01)
(52) U.S. Cl.
CPC .............................. *G06F 17/5081* (2013.01)
(58) Field of Classification Search
CPC .................................................. G06F 17/5022
USPC ......................................................... 716/114
See application file for complete search history.

(56) References Cited

U.S. PATENT DOCUMENTS

| | | | |
|---|---|---|---|
| 5,502,647 A * | 3/1996 | Chakradhar et al. | 716/132 |
| 6,317,860 B1 * | 11/2001 | Heile | 716/102 |
| 2004/0163018 A1 * | 8/2004 | Yoshida | 714/48 |
| 2011/0239179 A1 * | 9/2011 | Shibatani et al. | 716/122 |
| 2012/0297350 A1 * | 11/2012 | Yamamoto | G06F 17/504 716/102 |

* cited by examiner

*Primary Examiner* — Suchin Parihar

(57) ABSTRACT

System and method of determining flip-flop counts of interconnects of a physical layout during integrated circuit (IC) design. The outputs of each logic block are defined as primary inputs, and the inputs of each logic block are defined as primary outputs. Each interconnect is traversed from a primary input a primary output to identify the flip-flops and determine the flip-flop count. If an interconnect has a greater flip-flop count than an RTL estimated count, measures are taken to reduce the need for flip-flops with the current routing design. If the interconnect has a smaller flip-flop count than an RTL estimated count, additional flip-flops are inserted.

19 Claims, 7 Drawing Sheets

DETERMINATION OF FLIP-FLOP COUNT IN PHYSICAL DESIGN

TECHNICAL FIELD

The present invention is related to the field of integrated circuit design. In particular, the present invention is related to flip-flop insertions in physical design.

BACKGROUND

Interconnect optimization is a critical component of circuit design, and in particular, of Very Large Scale Integration (VLSI) circuit design. As part of interconnect optimization of a VLSI circuit design, repeaters (e.g., buffers and inverters) are used to reduce interconnect delay and to meet transition time/noise constraints. However, merely using repeaters does not solve all timing requirements; for example, when wire delay is greater than a clock cycle, the mere addition of repeaters may not solve the timing constraints and the insertion of flip-flops/latches is essential.

As a VLSI circuit is usually deeply pipelined and so the number of flip-flops in the circuit is significant, a design automation software tool is used to insert flip-flops in the circuit design to reduce the Register-Transfer-Level (RTL)-to-layout convergence time. Typically, the RTL specification determines the number of clock cycles required for each sender-receiver path in the design. When data from the sender logic requires more than one clock cycle to reach the receiver logic, a flip-flop is typically added to the RTL specification of the circuit design. Accordingly, an estimated flip-flop insertion count can be derived from the RTL design.

An automatic flip-flop insertion method can be used to implement the physical placement of the flip-flops based on the RTL specifications. The RTL design usually provides estimated quantity and locations of flip-flop insertions in the circuit merely to meet the latency constraints, e.g., based on distance and clocking cycles. Unfortunately, the RTL estimations usually do not match the physical implementations of flip-flop insertions in the subsequent physical design. The disagreement may force the designers to modify the physical design (such as placement or routing) or even logic design, which undesirably prolongs the RTL-to-layout convergence time.

Further, after flip-flop insertions are implemented in a physical layout, the information on the flip-flop counts for the nets is useful to verify the implementation and thereby identify a problematic net. As modern integrated circuits are enormously complicated and a logic interface may include thousands of nets for instance, it has been very time-consuming to determine the respective flip-flop counts in the numerous interconnects.

SUMMARY OF THE INVENTION

Therefore, it would be advantageous to provide a design automation mechanism of implementing flip-flops insertions in physical design without perturbing the routing or placement. It would also be advantageous to provide a fast approach to determine the flip-flop insertion count for each path in a given physical implementation.

Accordingly, embodiments of the present disclosure utilize a computer implemented method of automatically performing flip-flop insertions for each interconnect path (e.g., a net) by using an RTL-estimated count limit as a constraint. The RTL design of an integrated circuit provides an upper count limit for flip-flop insertions for a logic interface based on a logic-level latency requirement. The RTL design is synthesized into a physical layout with placement and routing. A timing analysis is performed on the physical design and yields a timing report. Based on the timing report, a flip-flop insertion count that is actually needed for each net is derived and candidate locations for insertions are automatically detected. The timing report is post-processed against a set of constraints, and thereby ineligible locations for flip-flop insertions are identified.

Embodiments of the present disclosure further employ a computer implemented method of automatically determining the flip-flop insertion counts for respective nets in a logic interface. With respect to a physical layout of an integrated circuit with flip-flop inserted, the outputs of a sender logic block are defined as primary inputs and the inputs of a receiver logic block are defined as primary outputs. Each net between a primary input and a primary output is traversed for processing and the flip-flops on the net are identified. In some embodiments, the physical layout may be provided to a logic equivalence check (LEC) program capable of efficiently identifying flip-flops between the primary inputs and outputs on the nets. A report is then generated listing the flip-flop count on each net of the logic interface.

For each logic interface, the reported flip-flop counts are compared with the RTL count limit. The paths having a different flip-flop count than the RTL count limit are identified for adjustment. More specifically, if a net has more flip-flop than the RTL count limit, the timing variables related to propagation delay or timing budgets are iteratively adjusted and timing-analyzed until the timing requirements for the net can be satisfied using the RTL count limit. On the other hand, if all the nets in a logic interface have fewer flip-flop insertions than their RTL count limit, the information can be fed back to RTL design to update the count limit.

According to embodiments of the present disclosure, because the count limit defined in RTL design is used as a limit for implementing flip-flop insertions in the physical design, the flip-flop insertions resulting from the automated process can satisfy the timing requirements without the need for significantly modifying the physical routing or the logic design. In addition, the number of actually inserted flip-flops on each net can be determined in a quick and simple process. The RTL-to-layout convergence time can be significantly and advantageously reduced.

According to one embodiment, a computer implemented method of determining flip-flop counts of interconnects of a physical layout during integrated circuit (IC) design includes: accessing the physical layout and accessing identifications of start points and end points of the interconnects. The interconnects are disposed between a sender logic block and a receiver logic block and inserted with flip-flops. The start points correspond to outputs of the sender logic block, and the end points correspond to inputs of the receiver logic block. The start points are assigned as primary inputs, and the end points are assigned as primary outputs. Flip-flops in the interconnects are identified by traversing from the primary inputs to the primary outputs. Respective numbers of flip-flops in the interconnects are determined accordingly. Any net having a number of flip-flops different from the count limit is identified.

This summary contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Figure 1A:
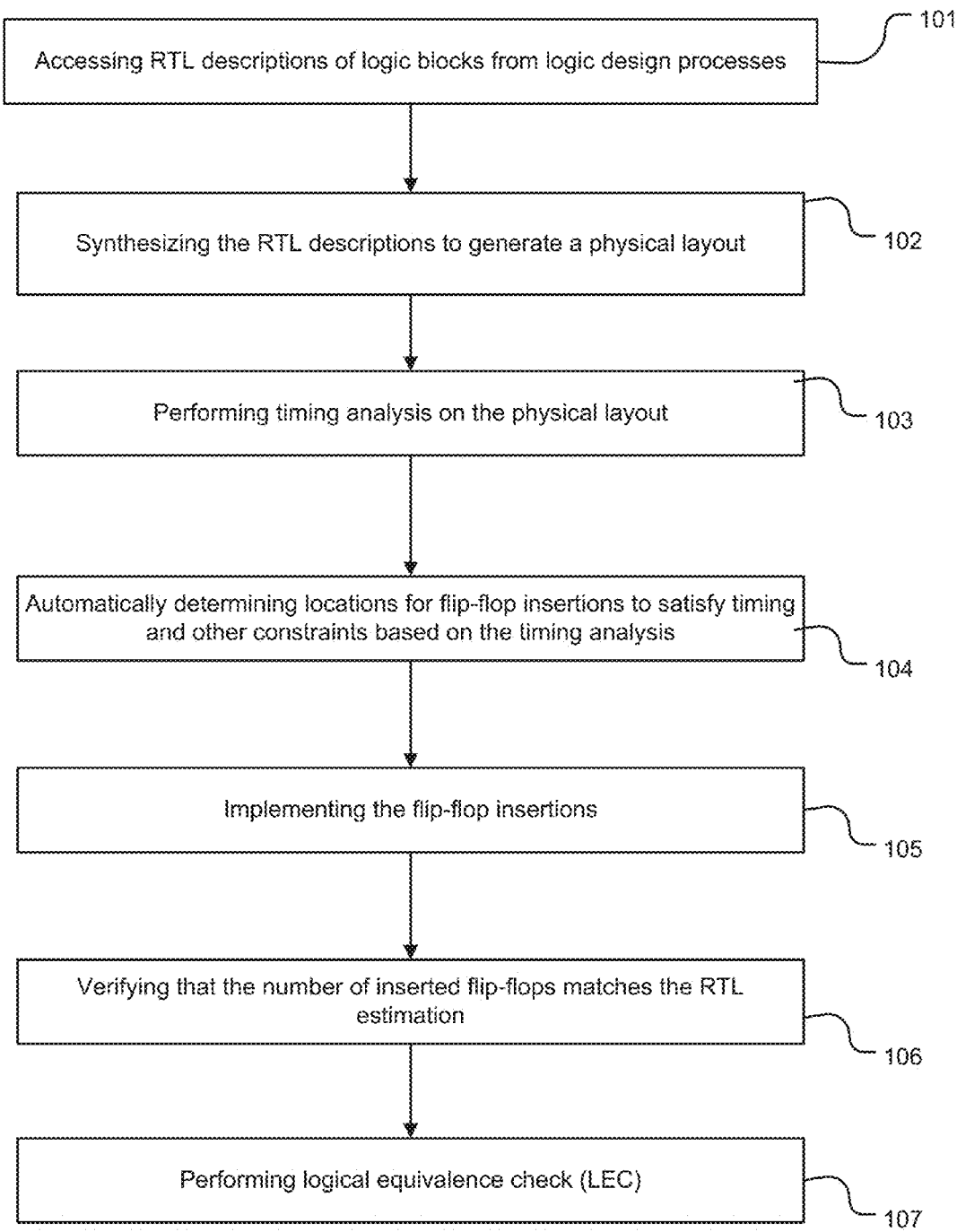
FIG. 1A is a flow chart depicting an exemplary method of performing flip-flop insertions in the physical design of an integrated circuit according to an embodiment of the present disclosure

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or client devices. When a component appears in several embodiments, the use of the same reference numeral signifies that the component is the same component as illustrated in the original embodiment.

Determination of Flip-Flop Count in Physical Design

Overall, embodiments of the present disclosure utilize an automated process to analyze a timing report of a physical layout to determine appropriate flip-flop insertions for the nets in a logic interface. Locations for flip-flop insertions are determined automatically according to timing requirements and a set of constraints. Following a flip-flop insertion process, the flip-flop count for each net in a logic interface is determined automatically by utilizing a program capable of identifying the flip-flops in a fast speed. The outputs of the logic blocks are set as primary inputs and the inputs of the logic blocks are set as primary outputs. The program is operable to traverse each path from a primary input to a primary output to identify the flip-flops. A flip-flop count report is thus generated and includes number of flip-flops in each path.

A flip-flop insertion maximum count defined in the logic design is used as a count limit for flip-flop insertions performed in the physical design. Given a physical implementation with flip-flops inserted, the flip-flop count for each path in a logic interface is compared with the count limit set for the interface. If latency requirements cannot be satisfied within the count limit and would dictate additional insertions, the variables related to propagation delay and/or timing budget are modified to satisfy the timing requirements without rerouting or changing the logic design.

Herein, unless specified otherwise, the term of "flip-flop insertion" refers to the operations of adding a flip-flop on a net or replacing a buffer or inverter on the net with a flip-flop.

FIG. 1A is a flow chart depicting an exemplary method 100 of performing flip-flop insertions in the physical design of an integrated circuit according to an embodiment of the present disclosure. The integrated circuit may be an application-specific integrated circuit (ASIC), Silicon-on-Chip (SoC), or a field-programmable gate array (FPGA), etc. Method 100 may be performed by one or more design automation software programs or scripts, etc.

At 101, following the logic design, the RTL descriptions of the integrated circuit are accessed. Based on the estimated timing (e.g., estimated line distances and clock period) from the logic design, the RTL design yields an estimated count limit for flip-flop insertions for each logic interface, where each interface includes a plurality of nets. At 102, the RTL descriptions are synthesized as a physical layout through the processes of partitioning, floor-planning, placement, clock tree analysis, signal routing, etc. At 103, a timing analysis is performed on the physical implementation of the integrated circuit, which generates a timing report. The timing report provides information regarding timing violations and propagation delay along each net.

At 104, the timing report is automatically analyzed against a set of constraints for flip-flop insertions to determine the legal locations for flip-flop insertions. More specifically, the timing report produces the candidate locations for each net to satisfy timing requirements. As described in greater detail below, the logic design also imposes constraints with respect to flip-flop insertions in addition to the timing requirements. Thus, certain types of locations are treated as ineligible for flip-flop insertions and are automatically flagged as illegal for subsequent insertion operations.

According to the present disclosure, the RTL design estimates a maximum count for flip-flop insertions in each net of a logic interface. The estimated maximum count is used as an upper limit (or the RTL count limit) in the insertion determinations during the physical design. Particularly, based on the timing requirements and the location constraints, if the actually needed count for a net in the physical implementation exceeds its RTL count limit, the net is automatically adjusted to reduce the actually needed count without changing the routing.

In some embodiments, selected timing-related net variables and/or the timing budget can be incrementally varied until the actually needed count falls under the RTL count limit. For example, to speed up signal transmission, the clock-to-Q time and clock skew can be changed, and a standard cell can be replaced with the faster one. The clock period can be varied to allow more timing budget. Various other suitable measures that are well known in the art may also be performed to decrease the need for flip-flop insertions without changing routing.

The net is iteratively modified and/or the buffers and inverters are appropriately sized and/or swapped with higher speed versions and timing-analyzed until the timing requirements are satisfied by inserting flip-flops less than the count limit. In this manner, the timing requirement from the logic design can be advantageously satisfied while avoiding the need for significantly changing routing or layout.

At 105, flip-flop insertions are implemented at the identified locations which are typically repeater stations or cells, e.g., buffers and inverters. Each identified location is automatically associated with an operation of either adding a new flip-flop or replacing a repeater with a flip-flop. For example, if a cell is an inverter, a new flip-flop is inserted. If a cell is a large buffer, a flip-flop is inserted before the buffer. If a cell is a buffer that is small enough, the cell is replaced with a flip-flop. In some embodiments, the flip-flop insertions are automatically implemented as an engineering change order (ECO) in a placement and routing (P&R) software tool.

At 106, after flip-flop insertions, the number of flip-flops on each net is verified to ensure it is equal to the RTL count limit set for the interface, as described in greater detail with reference to FIGS. 1B and 1C. Any net with a flip-flop count different from its RTL count limit is identified for adjustment according to the processes 104-105. The foregoing steps 104-106 may be repeated until the flip-flop count of each net matches its RTL count limit.

At 107, after flip-flop insertions, logical equivalence check (LEC) is performed to verify the physical implementation of the IC. In one embodiment, the modified implementation may be subject to another timing analysis to ensure an even number of inversions between flip-flops. More specifically, the resulted timing report is automatically parsed. If there is a stage with an odd number of inversions, an inverter is inserted before the flop and one after it. Alternatively, the inverter is replaced before and after the flop with a buffer. The foregoing steps 101-107 are repeated for each round of RTL-to-layout synthesis.

Figure 1B:
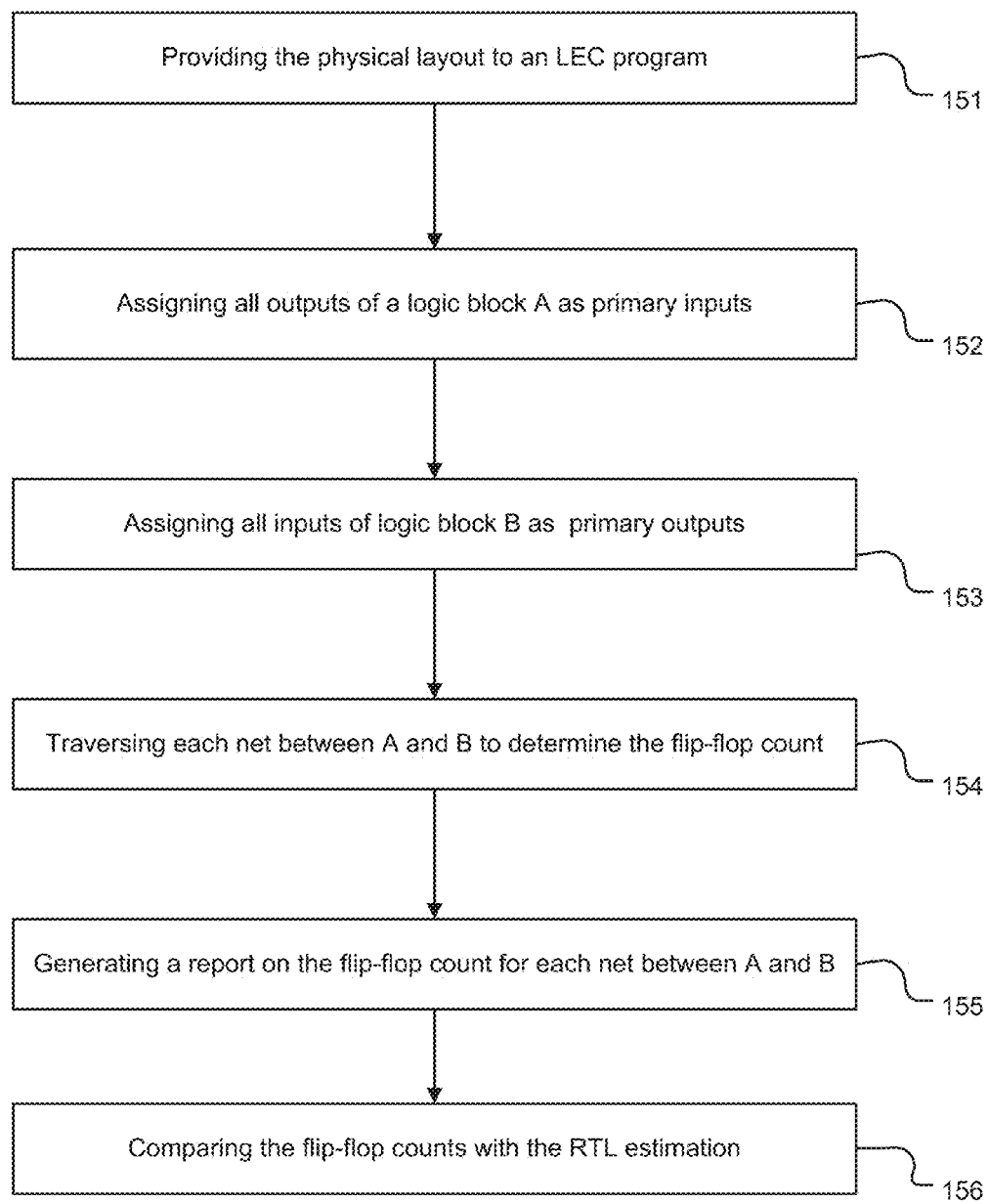
FIG. 1B is a flow chart depicting an exemplary computer implemented method of determining a count of inserted flip-flops of each net in a physical implementation in accordance with an embodiment of the present disclosure.

FIG. 1B is a flow chart depicting an exemplary computer implemented method 150 of determining the count of inserted flip-flops of each net in a physical implementation in accordance with an embodiment of the present disclosure. Method 150 may be implemented as a software program having an interface with a commercially available LEC tool. However, it will be appreciated that any other software program or commercial tool capable of determining a number of flip-flops between a primary input and a primary output can also be utilized without departing the scope of the present disclosure.

At 151, the physical layout with flip-flops inserted in the nets is provided to the LEC tool. With respect to an interface between a sender logic block A and receiver logic block B for instance, all the outputs of the block A are assigned as primary inputs at 152, and all the inputs of block B are assigned as primary outputs at 153. At 154, the LEC tool operates to traverse each net from the associated primary input through the corresponding primary output to identify the flip-flops along the net. At 155, the LEC tool generated results are post-processed to count the number of flip-flops from each primary input to each primary output and produce a list. The list includes the start point, the end point, and the flip-flop count associated with each net, and optionally various other information. The present disclosure is not limited by the format or content of the list which provides the flip-flop count for each net.

At 156, the reported flip-flop counts for the interface between blocks A and B are compared with the RTL estimated count. Thus, any net with a different flip-flop count than the estimated count is identified for adjustment, as described in detail with reference to FIGS. 1A and 4. The foregoing steps 151-156 are repeated following each round of flip-flop insertion.

Figure 1C:
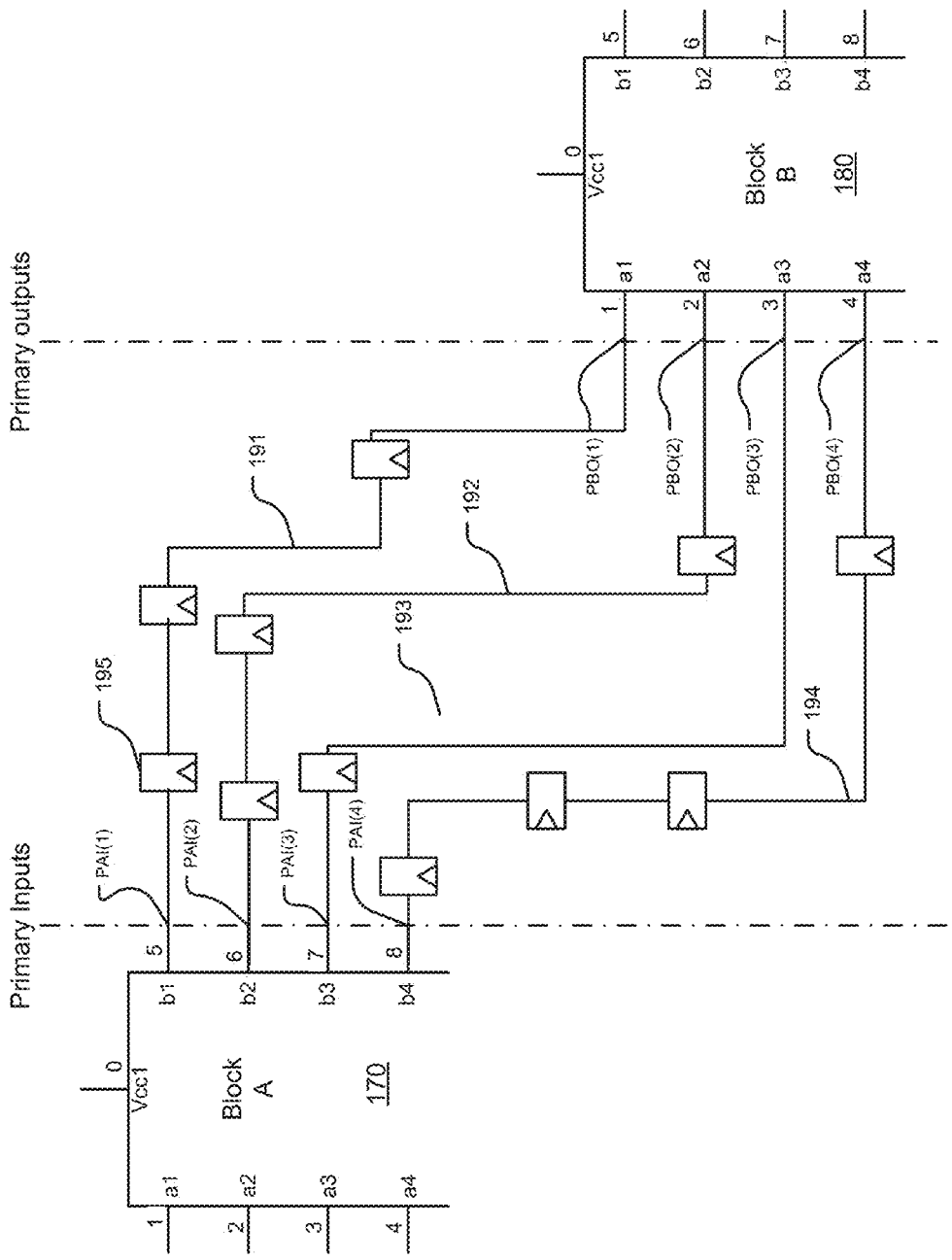
FIG. 1C illustrates an exemplary logic interface in which the flip-flop counts can be determined in accordance with an embodiment of the present disclosure.

FIG. 1C illustrates an exemplary logic interface in which the flip-flop counts can be determined in accordance with an embodiment of the present disclosure. The interface between the sender logic block A 170 and receiver logic block B 180 includes a plurality of nets, such as 191-194. Each net has flip-flops (e.g., 195) inserted through a flip-flop insertion process. According to the present disclosure, the outputs of the block A 170 are set as primary inputs for analysis, e.g., represented as PIA(1)-PIA(4); and the inputs of the block B 180 are set as primary outputs for analysis, e.g., represented as POB(1)-POB(4). As such, the interface can be treated as if being isolated from the logic blocks 170 and 180.

Provided with the primary inputs and primary outputs, the LEC tool (or any other suitable program or tool) can traverse each net between a primary input and a primary output and generate information used for determining the number of flip-flops on the net. The information is then processed to generate a report including the start point, end point and the flip-flop count of each net.

For instance, the RTL estimated count for this interface is equal to 3. As illustrated, the nets 191 and 192 each have three flip-flops; while the net 193 has one and the net 194 have four. Due to the discrepancies with the RTL estimated count, the nets 193 and 194 are flagged indicating the needs for adjustment, as described in greater detail with reference to FIGS. 1A and 4. Particularly, additional two flip-flops are to be inserted at appropriate locations on net 193, and a flip-flop on net 194 is to be removed. As a result, timing requirements for all nets can be satisfied using a number of flip-flops as defined in the RTL design.

The set of constraints for flip-flop insertions are user-configurable based on various logic design requirements. In some embodiments, one of the constraints prohibits flip-flops from being inserted before a convergent node or divergent node on a net. Generally, in conventional functional design, a separate RTL description is generated for each logic block, even for functionally equivalent blocks. This is because the physical design likely results in different physical placement and routing and thus different latency associated with each logic block. A different approach is to minimize the routing and layout differences among functionally equivalent logic blocks by using convergent and divergent nodes. In this manner, multiple blocks share a long communication path between a pair of convergent and divergent nodes, thereby having similar propagation delay. As such, these functionally equivalent blocks can use a common RTL description for synthesis.

Figure 2:
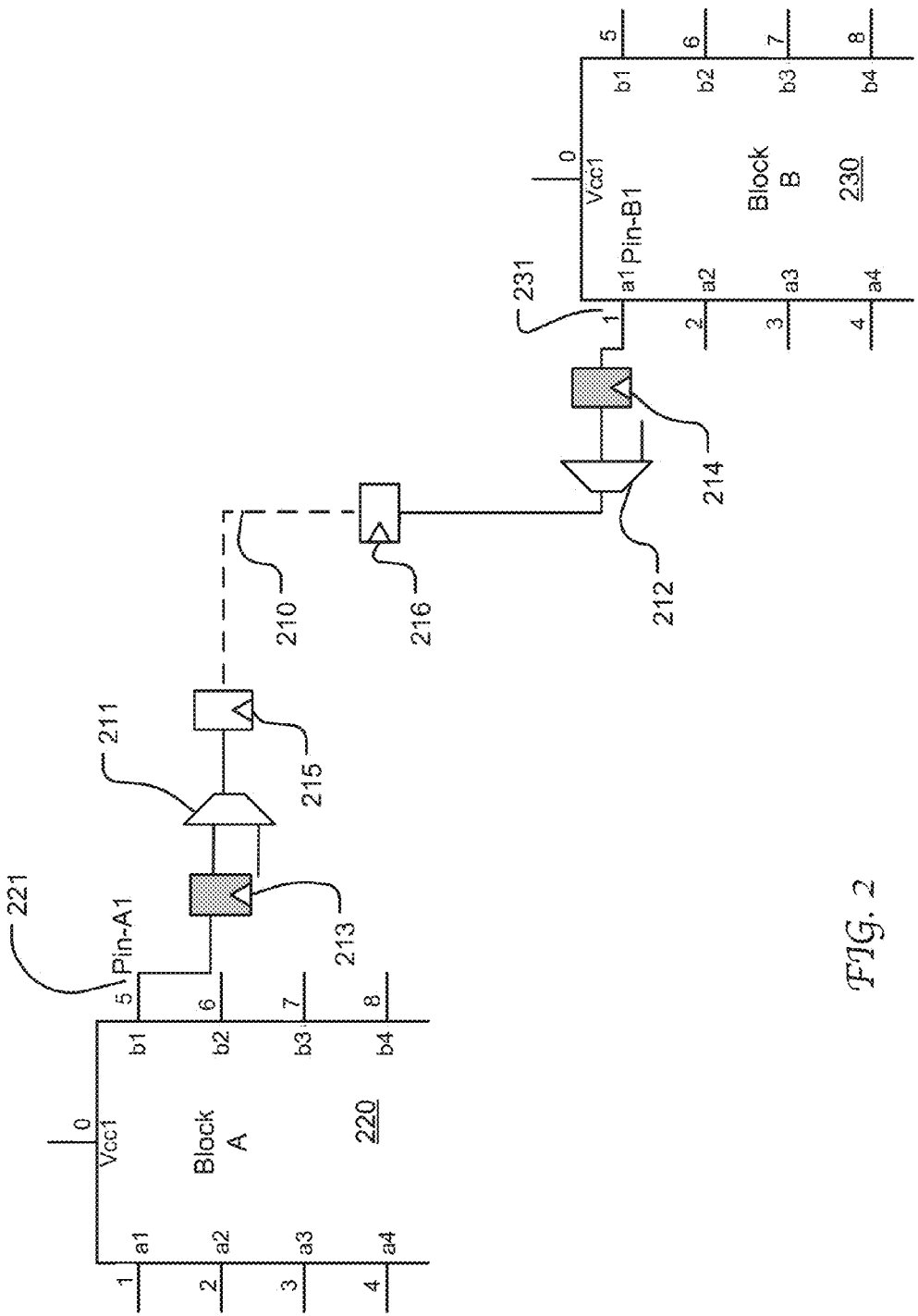
FIG. 2 illustrates an exemplary net having a convergent node and a divergent node which impose a flip-flop insertion constraint in accordance with an embodiment of the present disclosure.

The use of convergent and divergent nodes on a net imposes a constraint with respect to flip-flop insertions. FIG. 2 illustrates an exemplary net 210 having a convergent node 211 and a divergent node 212 which impose a flip-flop insertion constraint in accordance with an embodiment of the present disclosure. The net connects the Pin-A1 221 of the logic block A and the Pin-B1 231 of the logic block B. The net includes a convergent node 211 (e.g., a multiplexer) with its input coupled to Pin-A1 221 and pins of other logic blocks (not shown). The net also includes and a divergent node 212 (e.g., a demultiplexer) with its output coupled to Pin-B1 231 and pins of other logic blocks (not shown). As shown, the nodes 213 and 214 are ineligible for flip-flop insertions. Flip-flops can only be inserted between the nodes 211 and 212 to avoid logic errors, e.g., in nodes 215 and 216.

Figure 3:
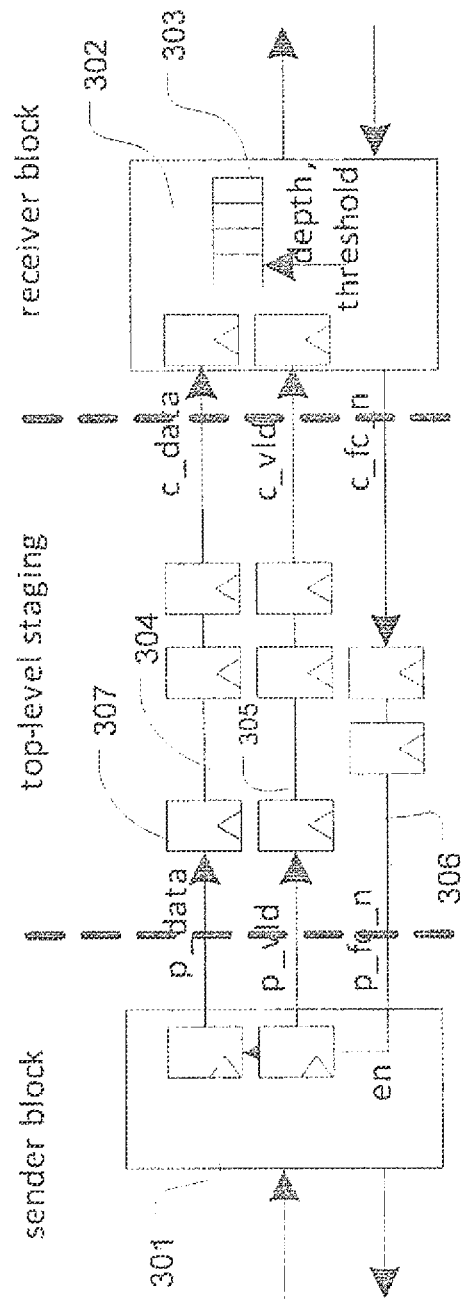
FIG. 3 illustrates an exemplary chip-level communication configuration adopting a delayed flow control protocol which imposes another flip-flop insertion constraint in accordance with an embodiment of the present disclosure.

In some embodiments, the communication between logic blocks adopts a delayed flow control protocol, where a First-in-First-out (FIFO) buffer in a receiver block is dependent on a top-level delay and it is required that the FIFO depth is greater than the round-trip latency. FIG. 3 illustrates an exemplary chip-level communication configuration adopting a delayed flow control protocol which imposes another flip-flop insertion constraint in accordance with an embodiment of the present disclosure.

As illustrated, three lines are routed between the sender block 301 and the receiver block 302, including a data line 304, a validation line 305 and a flow control line 306. Data signals are transmitted through the data line 304 from the sender bock 301 to the receiver block 302 and stored in the FIFO 303 within the receiver block 302. A data validation signal is transmitted from the sender block 301 to the receiving block 302 until the data transmission is completed. Amid data transmission, if the FIFO 303 has no vacancies, a flow control signal is sent back to the sender block 301 via the flow control line 306 to inform the sender block 301 to suspend data transmission. For such a configuration, a flip-flop insertion constraint is defined to ensure that the round trip-latency is less than the time to fill up the FIFO 303.

It will be appreciated that various other constraints or optimization criteria with respect to flip-flop insertions can be defined to ensure timing/function correctness and optimization. A set of constraints may be applied to determine legal and optimized insertion locations in any suitable manner that is well known in the art. For example, illegal insertion locations can be identified and recorded on the timing report based on the naming convention for the components in the nets as used in the timing analysis tool.

Figure 4:
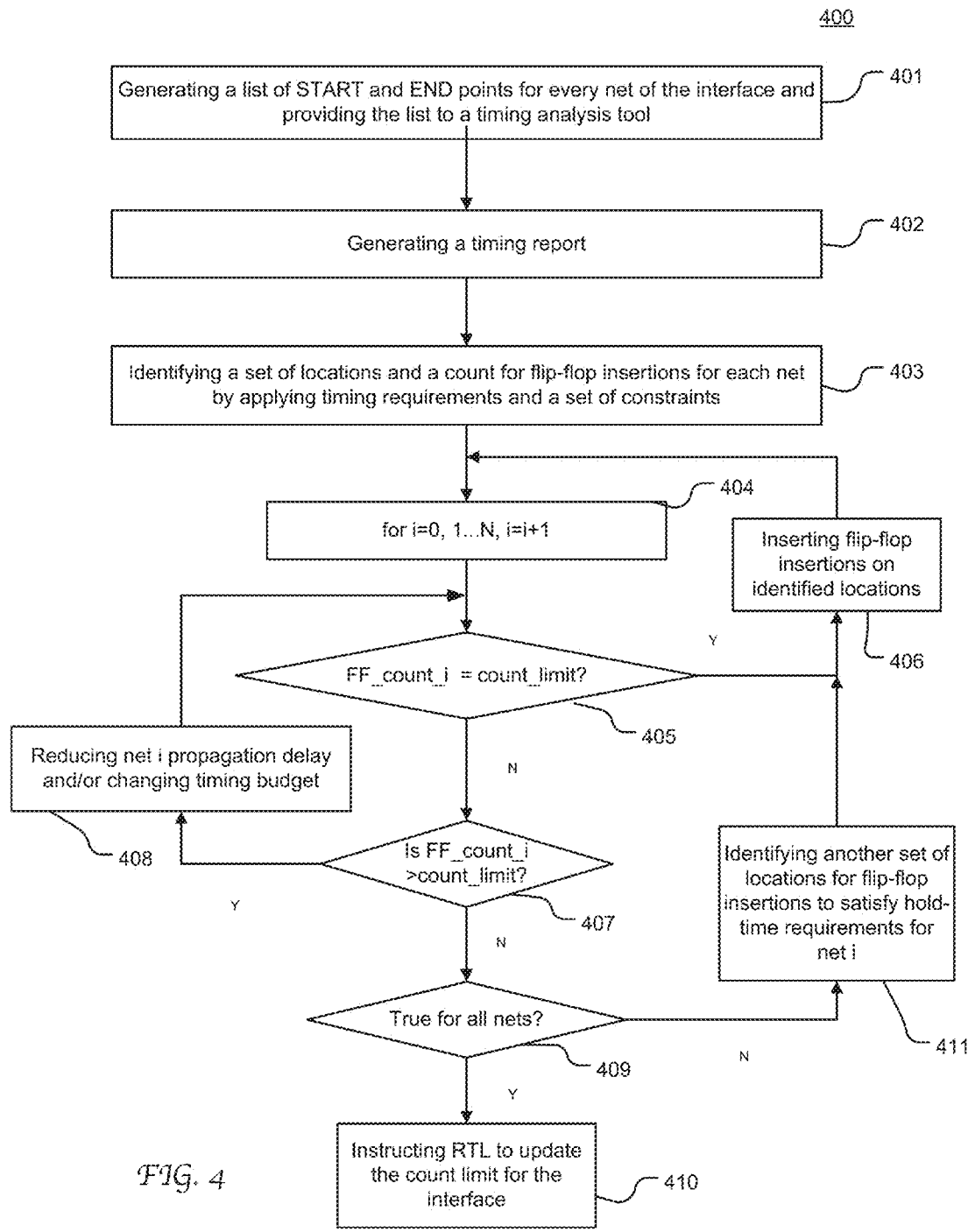
FIG. 4 is a flow chart depicting an exemplary computer implemented process of flip-flop insertions in accordance with an embodiment of the present disclosure.

FIG. 4 is a flow chart depicting an exemplary computer implemented process 400 of determining locations for flip-flop insertions in accordance with an embodiment of the present disclosure. Process 400 is similar with the process 104 in FIG. 1A and may be implemented as a script having an interface with a timing analysis tool.

At 401, resulted from the physical implementation of the integrated circuit, a list of "start" and "end" points of every net in an interface is generated and provided to the timing analysis tool for timing analysis. The identifications of the "start" and "end" points of each net are automatically converted from the RTL command format to a format recognizable by the timing analysis program. It will be appreciated that the present disclosure is not limited to any specific timing analysis process or method. The RTL design produces an estimated maximum count for flip-flop insertions for each net of the interface. The maximum count serves as an upper limit for implementing flip-flop insertions in the physical design, as described below.

At 402, a timing report regarding the physical implementation is generated using the timing analysis program and provides a variety of timing-related information. At 403, the timing report is processed to determine a flip-flop insertion count that is actually needed given the present physical implementation. Each net is parsed and candidate insertion locations are automatically detected according to the timing requirements. Further, the candidate insertion locations are automatically filtered based on a set of constraints. A list of eligible locations (e.g., repeater stations) for flip-flop insertions is generated. Summary information derived from the timing report can also be added to the timing report, such as slew violations, opens/shorts, a number of flip-flops required, etc.

As noted above with reference to FIG. 2, a constraint may be defined to prohibit a flip-flop insertion before a convergent node or after a divergent node. In one embodiment, a convergent/divergent node may be identified from the report based on the naming convention and the FANIN/FANOUT number associated therewith. For instance, if the FANOUT value of a node is greater than 1 a flip-flop insertion in prohibited. Another constraint may be defined to prohibit flip-flops insertions in a path that has large slew violation or has shorts or opens in the path. Certain types of cells should not be replaced with a flip-flop despite the estimation of the timing report. For example, certain types of receiver cells that have built-in diodes for antenna violations should not be replaced with a flip-flop.

Starting from 404, each net of the interface is parsed to determine flip-flop locations based on information derived from the timing report, such as the identifications of repeaters that can be replaced by flip-flops, clock-to-Q delay, clock periods, set-up and hold time requirements and the number of flip-flops actually required to break the net i (the "FF_count_i").

In one scenarios, for net i, if it is determined (at 405) that the FF_count_i matches the count limit estimated by the RTL design, flip-flops are inserted at the identified legal locations at 406.

In another scenarios, if the FF_count_i exceeds the count limit (as determined at 407), measures are taken to reduce the need for insertion count with the current routing design (i.e., without involving routing modification) at 408. In one embodiment, the net is flagged, and one or more timing variables are automatically manipulated to reduce propagation latency and thereby advantageously reduce the required count of flip-flop insertions for this net. The measures may also include varying the timing budget. For example, the clock period can be increased and/or clock-to-Q delay can be decreased, e.g., by 50 ps in each iteration. A standard cell on the net can be replaced with a faster one. The clock skew can also be adjusted to satisfy timing. In a delayed flow control configuration, the timing budget can be borrowed between the forward path and the backward path.

In one embodiment, the adjustment process at 408 may include multiple adjustment iterations, where selected latency-related variables are varied in a particular order with the clock period increased in each iteration. It will be appreciated that the adjustment process at 408 may involve performing various other measures to speed up signal transmission along a line that are well known in the art. A timing analysis is performed following each adjustment until the timing requirements for the net are satisfied with flip-flop insertions under the count limit.

In still another scenario, if all nets in the interface need lower insertion counts than the count limit (as determined at 407 and 409), this information is fed back to the RTL design to lower the estimated maximum count for this interface (at 410). If it is not true for all nets (as determined at 407 and 409), net i is parsed again and appropriate locations for flip-flop insertions are identified according to the hold-time requirements at 411. At 406, flip-flop insertions are performed at the locations identified at 411.

As a result, the number of actually inserted flip-flops in a net can be made equal to the estimated count resulted from the RTL design, which advantageously ensures that the timing requirements imposed by specific logic designs are satisfied with the current routing.

However, if the FF_count_i is much higher than the count limit to the extent that the adjustment measures are insufficient to satisfy the timing requirements, rerouting or other changes in the physical or logic design can be performed. For instance, a threshold may be set for the difference between the FF_count_i and the count limit and used to trigger routing or other physical or logic design alteration.

Furthermore, after flip-flop insertions are performed, the actually inserted counts of flip-flops are verified and compared with the corresponding count limit. The flip-flop count for each net can be determined according to an exemplary process as described in detail with reference to FIGS. 1B and 1C. If any net has been inserted with a different number of flip-flops than the count limit, the foregoing processes as described with reference to 404-411 are repeated to adjust the net.

More specifically, if the actually inserted count of an identified net is greater than the count limit, the timing-related variables are adjusted in the attempt to satisfy timing requirements with the RTL estimated number of flip-flops, as described with reference to step 408. On the other hand, if the actually inserted count of an identified net is less than the count limit, additional flip-flops are inserted at appropriate locations as described with reference to steps 411 and 407. In another scenario that all nets have a smaller flip-flop count than the count limit, the RTL design is adjusted to update the count limit, as described with reference to steps 410. In still another scenario, if the number of flip flops in an identified net is greater than the count limit by a threshold value, rerouting may be performed to modify the net in view of the timing requirements.

Figure 5:
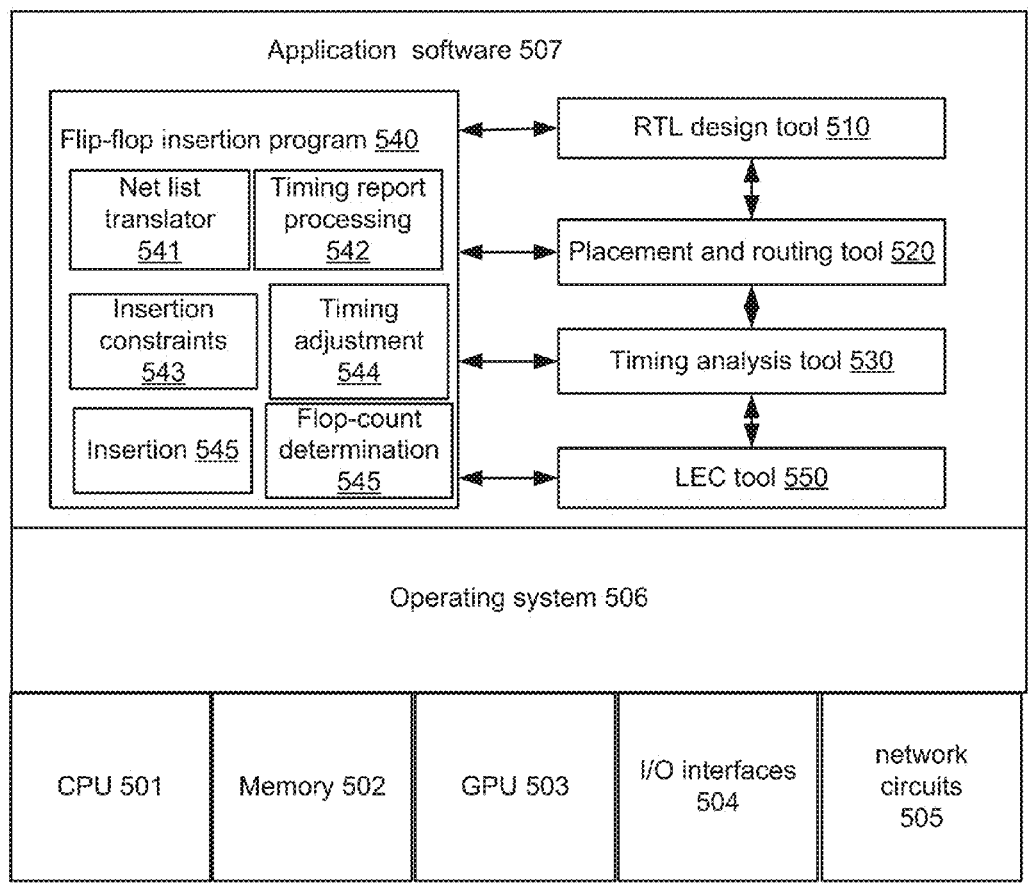
FIG. 5 illustrates a computing system configured to perform automated flip-flop insertions in accordance with an embodiment of the present disclosure.

FIG. 5 illustrates a computing system 500 configured to perform automated flip-flop insertions in accordance with an embodiment of the present disclosure. The computing system 500 includes a processor 501, system memory 502, a graphics processing unit (GPU) 503, I/O interfaces 504 and network circuits 505, an operating system 506 and application software 507 stored in the memory 502. The software 507 includes the RTL design tool 510, the placement and routing tool 520, the timing analysis tool 530, the flip-flop insertion program 540, and the LEC tool 550. The computing system 500 may be part of a server system configured for design automation.

When incorporating the user's function specifications for an integrated circuit and executed by the CPU 501, the RTL design tool 510 generates RTL descriptions of the logic blocks. The RTL descriptions are converted to gate-level descriptions of the circuit by a logic synthesis tool (not shown). The synthesis results are then used by placement and routing tools 520 to create a physical layout. A list of nets is derived from the physical layout. The nets are analyzed by the timing analysis tool 530 which outputs a timing report. A maximum count for flip-flop insertions is estimated for each net of an interface to satisfy the latency requirements based on the RTL design. The LEC tool 550 is used to verify the physical design in a manner that is well known in the art, as well as to cooperate with the flip-flop insertion program 540 to determine the flip-flop count for each net in the physical design.

The flip-flop insertion program 540 includes a netlist translator 541, a timing report processing module 542, a constraint module 543 storing the set of constraints, a timing adjustment module 544, an insertion module 545 and a flip-flop count determination module 546. The netlist translator 541 identifies the net by their start and end pins and translates the pin identifications to a command format recognizable by the timing analysis tool 530.

The timing report processing module 542 processes the timing report and identifies illegal or undesired locations for flip-flop insertions according to the set of constraints. The insertion module 545 determines the flip-flop counts that are needed based on the physical layout and compares it with the RTL count limit for each net. If the needed count is equal to the count limit, flip-flop insertions are performed. If the needed count is greater than the count limit, the timing adjustment module 544 adjusts the timing-related variables to decrease the propagation delay of the net or to allow more timing budget, e.g., by iteratively altering the clock period, clock-to-Q delay, standard cell or metal material, etc. If all the nets of the interface need fewer insertion count than the count limit, this information is fed back to update the RTL design.

The flip-flop count determination module 546 in combination with the LEC tool 550 can generate a report on the number of flip-flops in each net in a physical design. If any net has a different number from the count limit, the insertion module 545 operates to adjust the net as stated above.

The flip-flop insertion program 540 is configured to perform other functions as described in greater detail with reference to FIGS. 1A-4. Further, the insertion program 540 and the may include various other components and functions that are well known in the art. As will be appreciated by those with ordinary skill in the art, the flip-flop insertion program 540 can be implemented in any one or more suitable programming languages that are known to those skilled in the art, such as C, C++, Java, Python, Perl, TCL, etc.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law. Any claimed embodiment of the invention does not necessarily include all of the objects or embodiments of the disclosure.

What is claimed is:

1. A computer implemented method of determining flip-flop counts of interconnects of a physical layout during integrated circuit (IC) design, said computer implemented method comprising:
 accessing, by a processor, said physical layout comprising said interconnects disposed between a first logic block and a second logic block and flip-flops in said interconnects;
 accessing, by the processor, identifications of start points and end points of said interconnects, wherein said start points correspond to outputs of said first logic block, and wherein said end points correspond to inputs of said second logic block;
 assigning, by the processor, said start points as primary inputs;
 assigning, by the processor, said end points as primary outputs;
 traversing, by the processor, from said primary inputs to said primary outputs to identify said flip-flops in said interconnects;
 determining, by the processor, respective numbers of flip-flops in said interconnects based on said traversing;
 determining, by the processor, an estimated number of flip-flops for respective interconnects between said primary inputs and said primary outputs, wherein said estimated number is determined based on a Register-Transfer-Level (RTL) design of said physical layout;
 comparing, by the processor, said respective numbers of flip-flops with said estimated number of flip-flops; and
 determining, by the processor, whether to insert additional flip-flops in said interconnects based on said comparison.

2. The computer implemented method of claim 1, wherein said traversing comprises processing said physical layout in a program configured for a logic equivalence check (LEC) process.

3. The computer implemented method of claim 1 further comprising:
 identifying an interconnect from said interconnects, wherein said interconnect has a number of flip-flops that is greater than said estimated number; and
 adjusting timing-related variables to satisfy timing requirements with a reduced number of flip-flops and a current routing configuration of said interconnect.

4. The computer implemented method of claim 3, wherein said adjusting said timing-related variables comprises iteratively performing: adjusting a clock period; adjusting clock-to-Q delay; switching to a high speed standard cell; altering clock skew; or a combination thereof.

5. The computer implemented method of claim 3, if said number of flip flops is greater than said estimated number by a threshold value, rerouting said interconnect to satisfy said timing requirements.

6. The computer implemented method of claim 1 further comprising:
 identifying an interconnect from said interconnects, wherein said interconnect has a number of flip-flops that is smaller than said estimated number; and
 identifying a plurality of locations for inserting an additional flip-flop in said interconnect.

7. The computer implemented method of claim 1, if each interconnect of said interconnects has a number of flip-flops that is smaller than said estimated number, adjusting said estimated number for said interconnects.

8. The computer implemented method of claim 1 further comprising generating a list comprising said start points, said end points, and said respective numbers of flip-flops.

9. A computer implemented method of inserting flip-flops in an interface between logic blocks in physical design, said computer implemented method comprising:
 generating, by a processor, a list of start points and end points of interconnects of said interface;
 inserting, by the processor, said flip-flops in said interconnects based on timing analysis on said interconnects, a set of constraints, and timing requirements;
 defining, by the processor, said start points as primary inputs;
 defining, by the processor, said end points as primary outputs;
 traversing, by the processor, from said primary inputs to said primary outputs to determine respective numbers of flip-flops in said interconnects;
 comparing, by the processor, said respective numbers of flip-flops with a count limit of flip-flop insertions, wherein said count limit is defined for said interconnects in logic design; and
 determining, by the processor, whether to insert additional flip-flops in said interconnects based on said comparison.

10. The computer implemented method of claim 9, wherein said inserting comprises:
 performing timing analysis on a respective interconnect to identify timing violations; and
 applying said set of constraints to determine a plurality of locations for flip-flop insertions in said respective interconnect based on said timing violations.

11. The computer implemented method of claim 9 further comprising:
 identifying an interconnect having a number of flip-flops that is greater than said count limit; and
 adjusting timing-related variables to reduce said number of flip-flops while preserving a current routing configuration of said interconnect.

12. The computer implemented method of claim 9, if said number is greater than said count limit by a threshold, rerouting said interconnect to satisfy said timing requirements.

13. The computer implemented method of claim 11, wherein said adjusting said timing-related variables comprises iteratively performing: adjusting a clock period; adjusting clock-to-Q delay; switching to a high speed standard cell; altering clock skew; or a combination thereof.

14. The computer implemented method of claim 9 further comprising, if said interconnects each have a number of flip-flops that is smaller than said count limit, updating said count limit in Register-Transfer-Level (RTL) design.

15. The computer implemented method of claim 9 further comprising:
 identifying an interconnect having a number of flip-flops that is smaller than said count limit; and
 identifying a plurality of locations on said interconnect for flip-flop insertions according to hold-time requirements.

16. A system comprising:
 a processor;
 memory coupled to said processor and comprising instructions that, when executed by said processor, cause the system to perform a method of inserting flip-flops in interconnects in an interface between logic blocks during integrated circuit (IC) design, said method comprising:

inserting said flip-flops in said interconnects based on timing analysis report, a set of constraints, and timing requirements;

defining start points of said interconnects as primary inputs;

defining end points of said interconnects as primary outputs;

providing said primary inputs and said primary outputs to a program configured for logic equivalence check (LEC);

determining respective numbers of flip-flops in said interconnects based on a processing result generated by said program;

comparing said respective numbers of flip-flops with a count limit for flip-flop insertions, wherein said count limit is defined for respective interconnects of said interconnects in logic design based on estimated timing requirements; and determining whether to insert additional flip-flops in said interconnects based on said comparison.

17. The system of claim 16, wherein said method further comprises:

identifying an interconnect having a number of flip-flops that is greater than said count limit; and adjusting timing-related variables to satisfy the timing requirements with a reduced number of flip-flops and with a current routing configuration of said interconnect, wherein said adjusting comprises iteratively performing: adjusting a clock period; adjusting clock-to-Q delay; switching to a high speed standard cell; altering clock skew; or a combination thereof.

18. The system of claim 16, wherein said method further comprises, if said interconnects each have a smaller number of flip-flops than said count limit, adjusting said count limit for said interconnects in Register-Transfer-Level (RTL) design.

19. The system of claim 16, wherein said method further comprises: identifying an interconnect having a number of flip-flops that is smaller than said count limit;

determining locations on said interconnect based on hold-time requirements; and performing flip-flop insertions at said locations.

* * * * *